United States Patent
Tsang et al.

(10) Patent No.: US 6,432,847 B1
(45) Date of Patent: Aug. 13, 2002

(54) METHOD OF ACTIVATING P-TYPE COMPOUND SEMICONDUCTOR BY USING LASERS FOR REDUCING THE RESISTIVITY THEREOF

(75) Inventors: Jian-Shihn Tsang, Lu-Zhou; Wen-Chung Tsai, Chu-Pei; Tsung-Yu Chen, Keelung; Chia-Hung Hsu, Taipei Hsien; Wei-Chih Lai, Chiai Hsien, all of (TW)

(73) Assignee: Advanced Epitaxy Technology Inc. (TW)

( * ) Notice: Subject to any disclaimer, the term of this patent is extended or adjusted under 35 U.S.C. 154(b) by 0 days.

(21) Appl. No.: 09/587,211

(22) Filed: Jun. 1, 2000

(30) Foreign Application Priority Data

Mar. 10, 2000 (TW) ...................... 089104341 A

(51) Int. Cl.$^7$ ........................... H01L 21/26; H01L 21/42
(52) U.S. Cl. ..................... 438/795; 438/796; 438/688; 438/513; 438/487; 438/162; 438/46
(58) Field of Search ................... 438/795, 796, 438/688, 513, 46, 22, 29, 518, 39, 162, 487

(56) References Cited

U.S. PATENT DOCUMENTS

| | | | | | |
|---|---|---|---|---|---|
| 5,496,766 | A | * | 3/1996 | Amano et al. | 438/29 |
| 5,945,689 | A | * | 8/1999 | Koike et al. | 257/88 |
| 6,214,427 | B1 | * | 4/2001 | Levinson | 428/43 |

* cited by examiner

*Primary Examiner*—Matthew Smith
*Assistant Examiner*—Igwe U. Anya
(74) *Attorney, Agent, or Firm*—Christensen O'Connor Johnson Kindness PLLC

(57) ABSTRACT

A novel method of using lasers for generating driving energy for activating P-type compound semiconductor films and reducing the resistivity thereof. The P-type compound semiconductor films are made from III–V nitrides or II–VI group compounds doped with P-type impurity. The present invention can be carried out in the ambience of atmosphere rather than in the ambience of nitrogen gas. In addition, adjusting the power and focusing distance of a laser source, and the power density can change the time required by the activating process.

14 Claims, 6 Drawing Sheets

METHOD OF ACTIVATING P-TYPE COMPOUND SEMICONDUCTOR BY USING LASERS FOR REDUCING THE RESISTIVITY THEREOF

BACKGROUND OF THE INVENTION

1. Field of the Invention

The present invention relates in general to a method of reducing the resistivity of a semiconductor film. More specifically, it relates to a method of activating a p-type compound film to reduce the resistivity thereof by using infrared lasers with longer duration time and high density.

2. Description of the Related Art

The III–V nitrides of wide-band gap such as GaN, InGaN, AlGaN, AlGaInN, etc. and the II–VI group compounds such as P—ZnSe, ZnMgSe, etc. exhibit excellent semiconductor light emission, and therefore they are widely applied to form semiconductor films for fabricating optoelectronic devices such as Light Emitting Diodes (LEDs) and Laser Diodes (LDs). However, problems and limits have been encountered using such compounds for forming semiconductor films, therefore impeding the progress of optoelectronic industry.

Take gallium nitride (GaN) as an example. Due to a lack of appropriate substrates having lattices matched with gallium nitrides, so far gallium nitride films are formed only on sapphire substrates. For this reason, a gallium nitride film has to be formed using the technique of forming a buffer layer on the sapphire substrate in conjunction with the process of Metal-Organic Chemical Vapor Deposition (hereinafter referred to as MOCVD). When the gallium nitride film is doped with P-type impurity such as Be, Mg, Ca, Zn, Cd, etc. during the film's growth, the P-type impurity easily reacts with the hydrogen in the reaction gas (metal-organic compound gas). Therefore, the gallium nitride film formed on the sapphire substrate inevitably has high resistivity. The P-type gallium nitride film fabricated according to the conventional art generally has a resistivity higher than $10^5$ Ωcm and a hole concentration lower than $10^{12}$ cm$^{-3}$. Consequently, the application of the gallium nitride film is rather restricted.

I. Akasaki and H. Amano (NAGOYA university, Japan) disclosed a method which activates the P-type gallium nitride film doped with Mg using Low Energy Electron Beam Irradiation (LEEBI) so as to reduce the resistivity thereof. However, the method can not be effectively applied because the use of LEEBI cannot obtain good throughput due to low rate of activation. Further, this method can only reduce the resistivity of the surface portion of the gallium nitride film.

S. Nakamura (Nichia Chemical Industries, Ltd. Japan) disclosed a method using MOCVD method in conjunction with low-temperature gallium nitride buffer layer to form a P-type gallium nitride film on a substrate. Then, the P-type gallium nitride film is annealed at high temperature according to the conventional art, thereby reducing the resistivity of the P-type gallium nitride film. The annealing process is carried out at a temperature of between 400~1200° C. in the ambience of nitrogen gas. Also, a specific processing temperature between 400~1200 ° C. is kept for longer than one minute. Because Nakamura's method (process) must be carried out in the ambience of nitrogen gas or inert gas instead of in the ambience of atmosphere, the cost and difficulty of the above process rises sharply.

SUMMARY OF THE INVENTION

Therefore, an object of the present invention is to provide a novel method to overcome the above problems by using lasers to activate P-type compound semiconductor films for reducing the resistivity thereof.

The first feature of the present invention is that the activating process is performed in the ambience of atmosphere rather than in the ambience of nitrogen gas or inert gas.

The second feature of the present invention is that the time of the activating process can be selected by appropriately adjusting the power density of a laser light source. The power density can be tuned through the control of the emission power of the laser light source, and the focusing distance between the P-type compound semiconductor films and the laser light source.

The present invention achieves the above-indicated object by providing a method of activating P-type compound semiconductor film by using lasers for reducing the resistivity thereof. The method comprises the following steps.

(a) Grow a first P-type compound semiconductor film, wherein the first P-type compound semiconductor film is made from a III–V nitride or a II–VI group compound doped with P-type impurity.

The first P-type compound semiconductor film can be grown using metal-organic chemical vapor deposition (MOCVD) method, molecular beam epitaxy (MBE) method, or hydride vapor phase epitaxy (HVPE) method.

The III–V nitride can be selected from GaN, InGaN, AlGaN, or AlGaInN, and the II–VI group compound can be selected from P—ZnSe, ZnMgSe, etc.

(b) Expose the first P-type compound semiconductor film to a laser light source (for example, an infrared laser). The laser light source provides energy for breaking the bonds between the P-type impurity in the first P-type compound semiconductor film and the hydrogen so as to release the carriers of the P-type impurity. By this way, the first P-type compound semiconductor film is transformed into a second P-type compound semiconductor film.

It is noted that the resistivity of the second P-type compound semiconductor film is lower than that of the first P-type compound semiconductor film.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
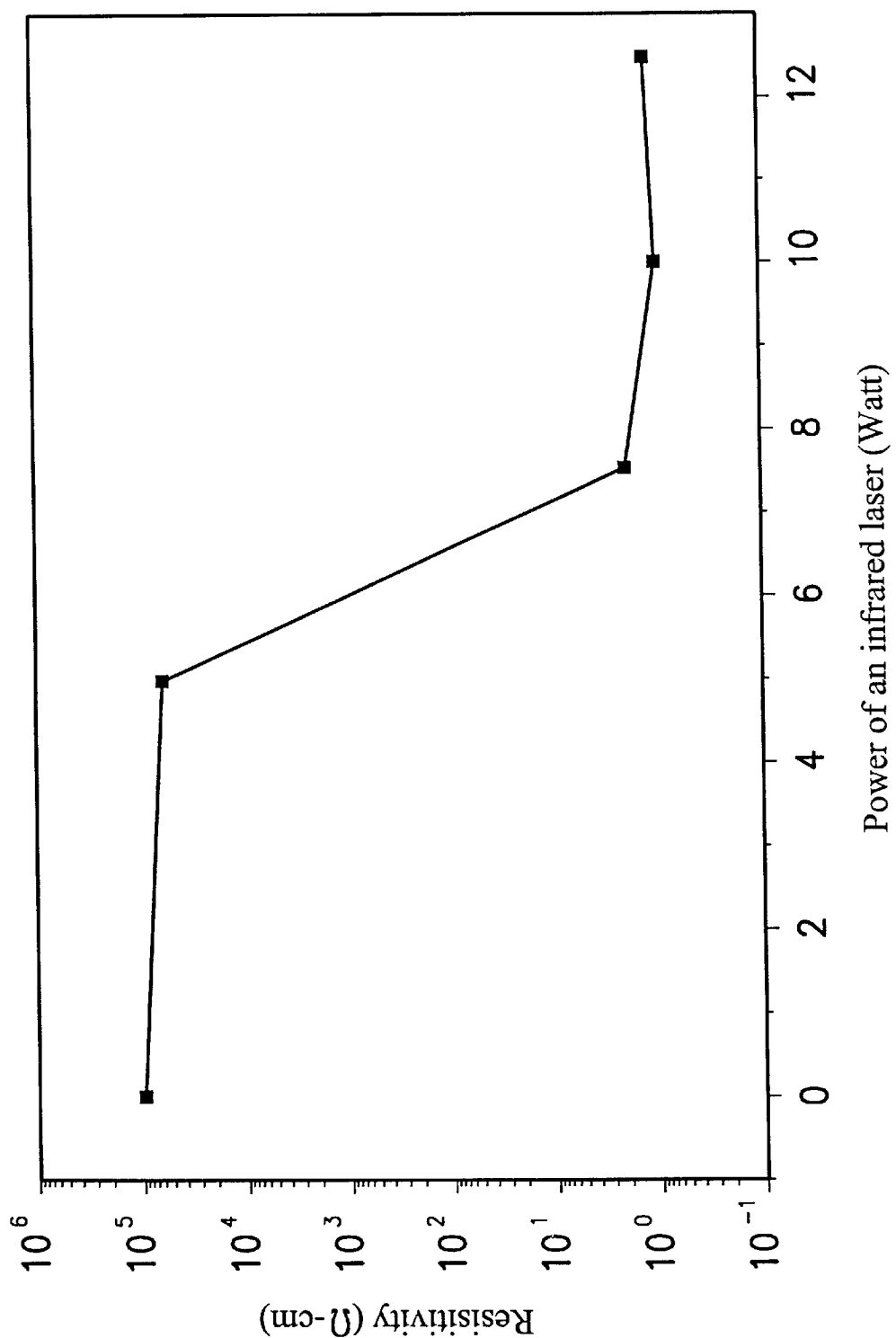
FIG. 1 shows the relation between the power of an infrared laser used for activation and the resistivity of a P-type gallium nitride film.

For brevity, this embodiment takes P-type gallium nitride films as an example to describe how the present invention uses lasers to generate driving energy for activating P-type gallium nitride films and reducing the resistivity thereof. However, the present invention is not limited to P-type gallium nitride films. All the P-type compound semiconductor films made from III–V nitrides (such as GaN, InGaN, AlGaN, AlGaInN, etc.) or II–VI group compounds (such as P—ZnSe, ZnMgSe, etc.) can be activated to reduce the resistivity thereof according to the present invention.

In addition, the present invention can be applied to different structures of P-type compound semiconductor films. The P-type compound semiconductor films can be formed in single layer structure, bulk structure, homojunction structure, or heterojunction structure.

The method of activating P-type compound semiconductor film by using lasers for reducing the resistivity thereof is described in detail as follows.

First, a first P-type gallium nitride film (GaN film) is grown on a substrate (for example, a sapphire substrate) by using the metal-organic chemical vapor deposition (MOCVD) method, molecular beam epitaxy (MBE) method, or hydride vapor phase epitaxy (HVPE) method. In this embodiment, MOCVD method is carried out. The P-type impurity doped into the gallium nitride is selected from Be, Mg, Ca, Ba, Cd, or Zn.

Because the P-type impurity easily reacts with the hydrogen in the reaction gas (such as the metal-organic compound gas in MOCVD process), the first P-type gallium nitride film formed on the sapphire substrate inevitably has high resistivity.

Then, the first P-type gallium nitride film is uniformly exposed to a laser light source. The laser light source provides instant energy as driving force to break the bonds of the P-type impurity and hydrogen in the first P-type gallium nitride film (removing hydrogen atoms from the first P-type gallium nitride film). The released carriers of the P-type impurity transform the first P-type gallium nitride film into a second P-type gallium nitride film, thereby activating the first P-type gallium nitride film and reducing the resistivity thereof.

Because the P-type impurity carrier (hole) concentration of the second P-type gallium nitride film is higher than that of the first P-type gallium nitride film, the resistivity of the second P-type gallium nitride film is lower than that of the first P-type gallium nitride film.

The laser light source can be selected from a gas laser, a solid-state laser, or a liquid laser. In this embodiment, the laser light source is an infrared laser, such as a $CO_2$ laser.

As above described, the first P-type gallium nitride film is activated using the infrared laser to provide power onto the P-type gallium nitride film. In general, the power of the infrared laser is set to be not greater than 50 W, however it also can be more than 50 W to meet certain requirements.

The time duration of exposing the P-type gallium nitride film to the infrared laser can be changed to meet different requirements of resistivity and light emission response. The required exposing time can be obtained by adjusting the emission power and the power density of the infrared laser, and selecting the focusing distance of the laser light source to the P-type gallium nitride films.

FIG. 1 shows the relation between the power of an infrared laser used for activation and the resistivity of a P-type gallium nitride film. From FIG. 1, it is very clear that the P-type gallium nitride film has a high resistivity (over the up-limit of the measuring instrument), before being activated by the infrared laser. In addition, when the power of the infrared laser used to activate the P-type gallium nitride film increases, the resistivity of the P-type gallium nitride film decreases correspondingly. When the power of the infrared laser increases to 10 W, the resistivity of the activated P-type gallium nitride film decreases to about 1.2 Ωcm.

Figure 2:
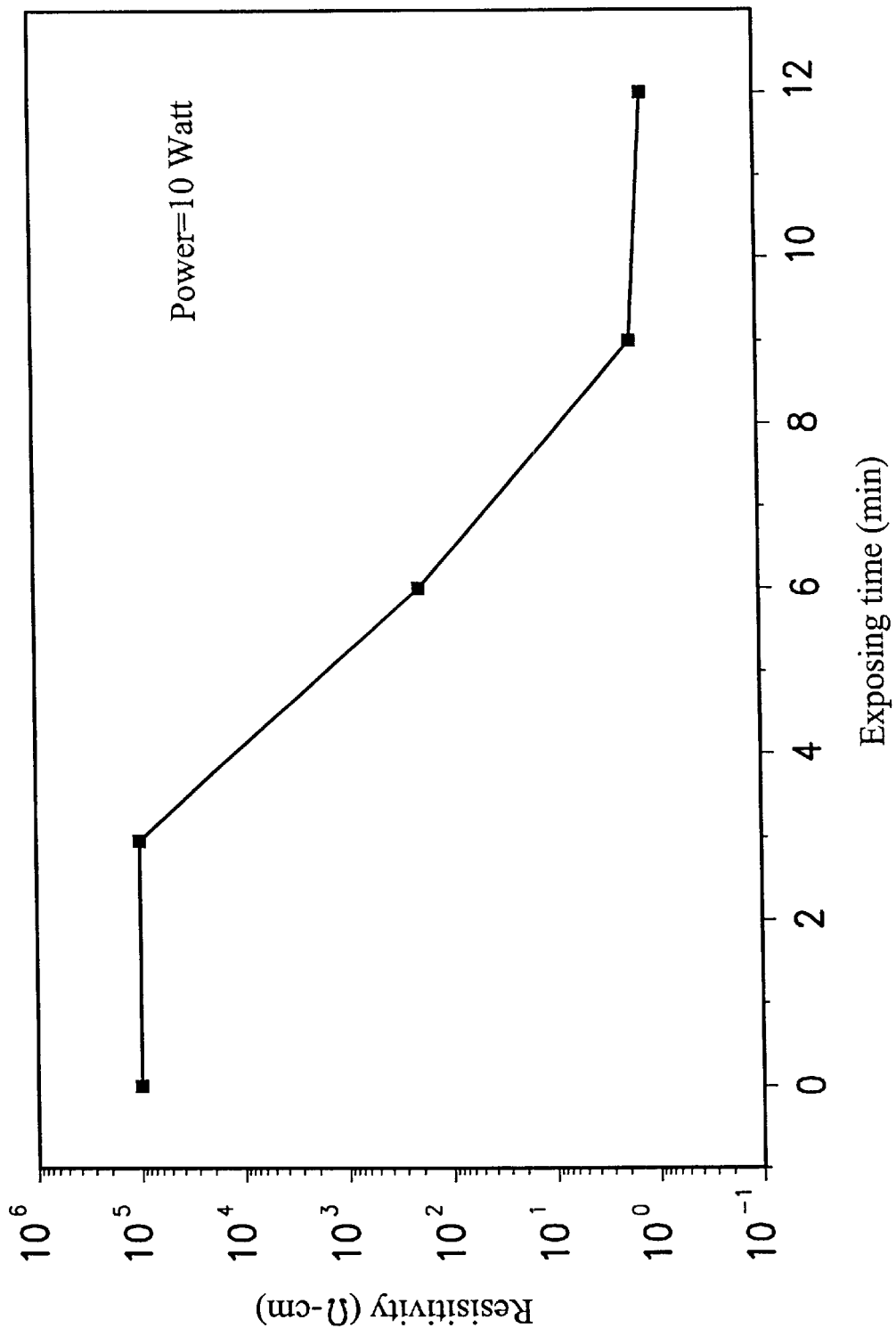
FIG. 2 shows the relation between the time duration of exposing a P-type gallium nitride film to an infrared laser and the resistivity of the P-type gallium nitride film.

FIG. 2 shows the relation between the time duration of exposing a P-type gallium nitride film to an infrared laser and the resistivity of the P-type gallium nitride film. From FIG. 2, it is clear that when the time duration for exposing the P-type gallium nitride film to the infrared laser increases, the resistivity of the P-type gallium nitride film decreases correspondingly, when the power of the infrared laser is 10 W. When the exposing time is 9 minutes, the resistivity of the activated P-type gallium nitride film decreases to about 1.48 Ωcm; and when the exposing time is 12 minutes, the resistivity of the activated P-type gallium nitride film decreases to about 1.2 Ωcm.

Figure 3:
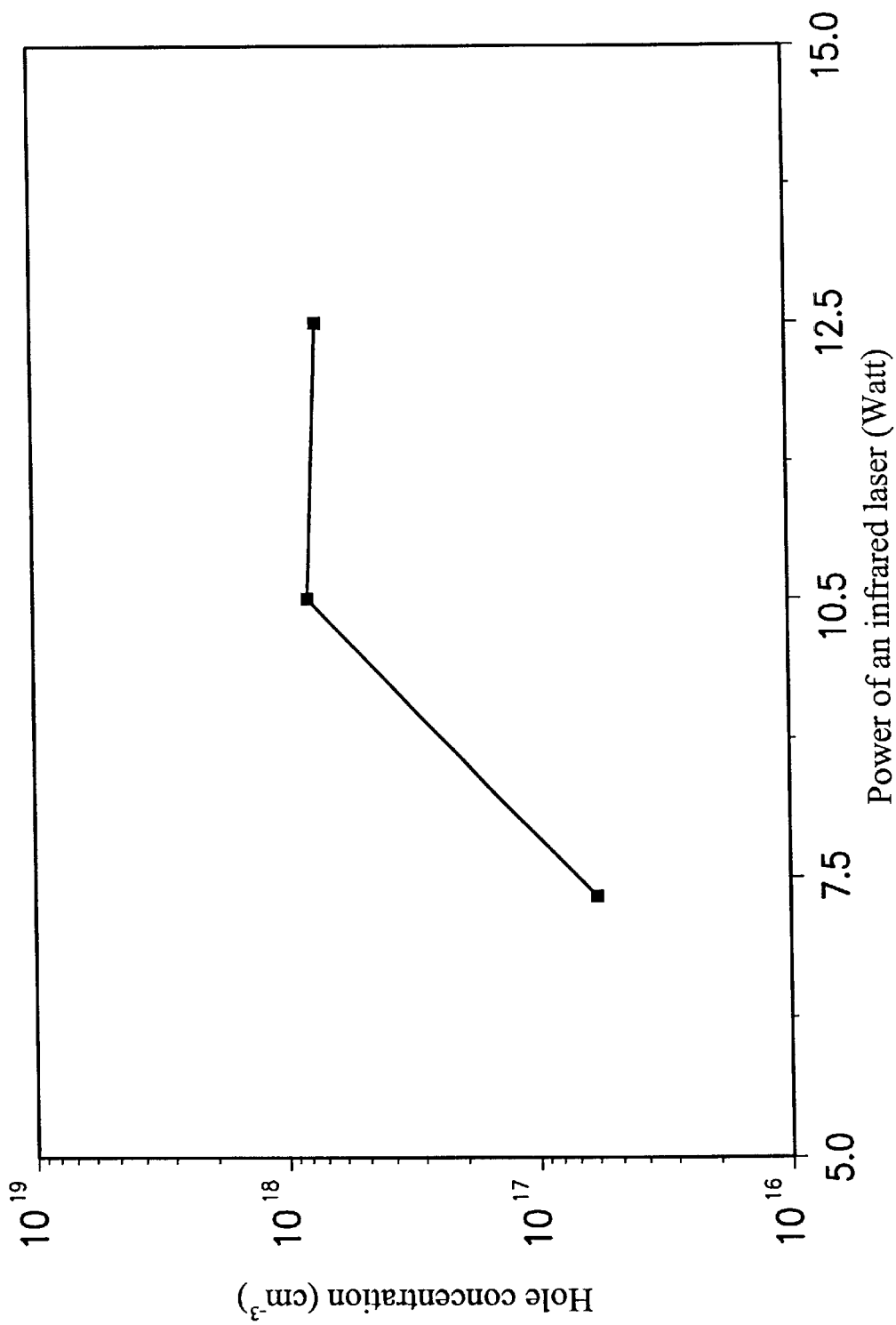
FIG. 3 shows the relation between the power of a infrared laser used for activation and the carrier concentration of a gallium nitride film.

In general, a P-type gallium nitride film not activated by the infrared laser has a low carrier or hole concentration of about $10^{12}$ cm$^{-3}$. The reason is that a portion of the holes or carriers (P-type impurity) are combined with the original N-type carriers in the gallium nitride film, and other portions of the P-type impurity form bonds with the hydrogen atoms in the metal-organic gas. FIG. 3 shows the relation between the power of an infrared laser used for activation and the carrier concentration of a gallium nitride film. When the power of the infrared laser increases, the hole concentration of the activated P-type gallium nitride film increases correspondingly because the bonds between the P-type impurity and the hydrogen atoms are broken by the energy coming from the infrared laser, thus releasing more free holes. As the power of the infrared laser increases to 10 W, the hole concentration increases to the value more than $7 \times 10^{17}$ cm$^{-3}$.

Figure 4:
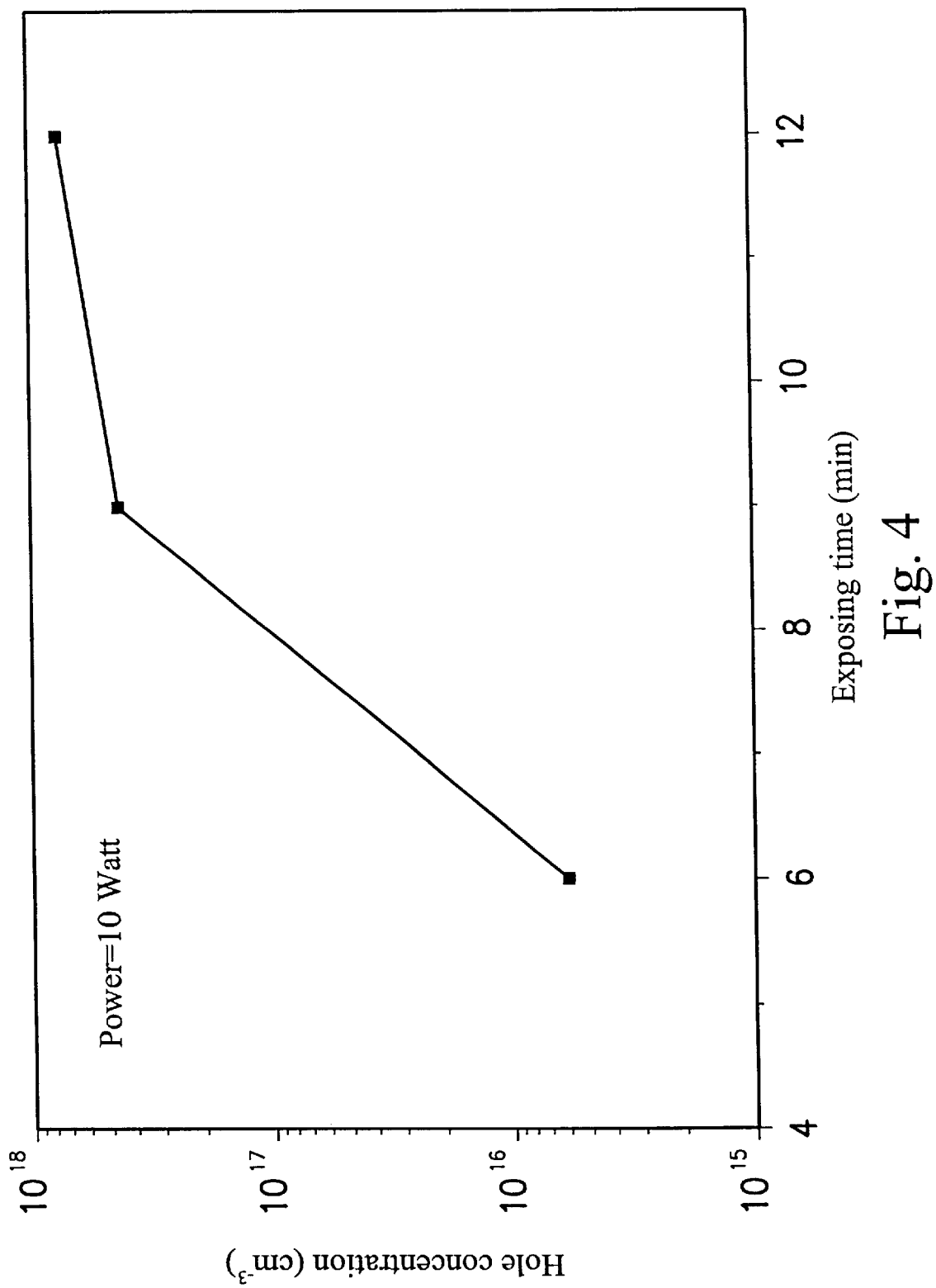
FIG. 4 shows the relation between the time duration of exposing a P-type gallium nitride to an infrared laser and the carrier concentration of the gallium nitride film.

FIG. 4 shows the relation between the time duration of exposing a P-type gallium nitride to an infrared laser and the carrier concentration of the gallium nitride film. As the time duration of exposing the P-type gallium nitride film to the infrared laser increases, the hole (carrier) concentration of the P-type gallium nitride film increases correspondingly because the energy from the infrared laser can breaking more bonds between the P-type impurity and the hydrogen atoms to release more free holes. In the condition of setting the power of the infrared laser to 10 W, when the exposing time is 9 minutes, the hole concentration of the activated P-type gallium nitride film reaches to about $4 \times 10^{17}$ cm$^{-3}$; and when the exposing time is 12 minutes, the hole concentration of the activated P-type gallium nitride film reaches to about $7 \times 10^{17}$ cm$^{-3}$.

Figure 5:
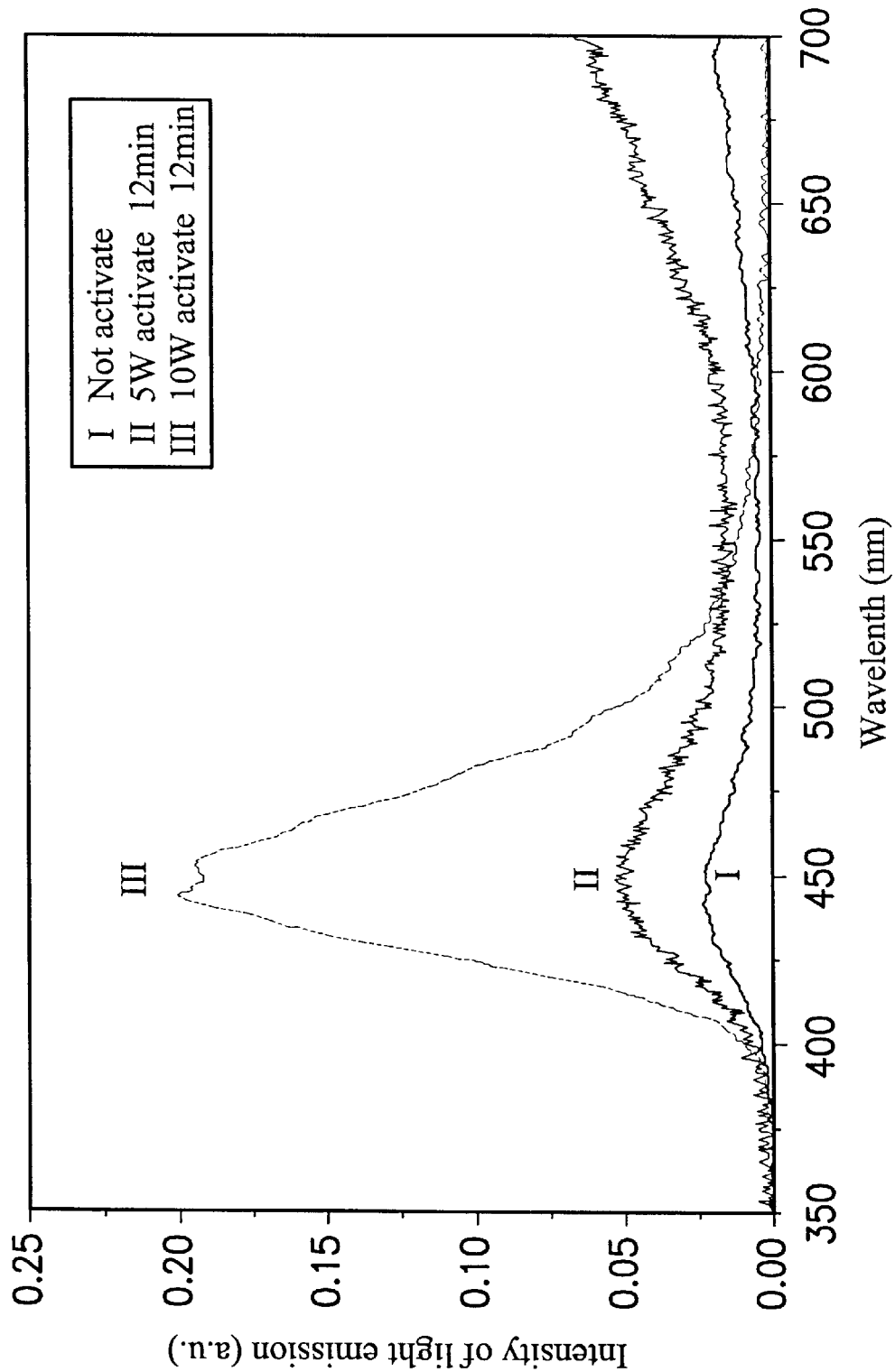
FIG. 5 shows the spectrum (frequency response) of a gallium nitride film activated by the infrared lasers with different powers.

FIG. 5 shows the spectrum (frequency response) of a gallium nitride film activated by the infrared lasers with different powers. Before the P-type gallium nitride film is activated by the infrared laser, the light emission response at a wavelength about 450 nm (blue light) is considerably small (curve I). As the power of the infrared laser increases (wherein the exposing time is 12 minutes), the intensity of light emission at a wavelength about 450 nm (curves II or III in FIG. 5) increases correspondingly. The above outcomes mean that the intensity of light emission at a wavelength about 450 nm can be improved by increasing the power of the infrared laser used for activating the P-type gallium nitride film.

Figure 6:
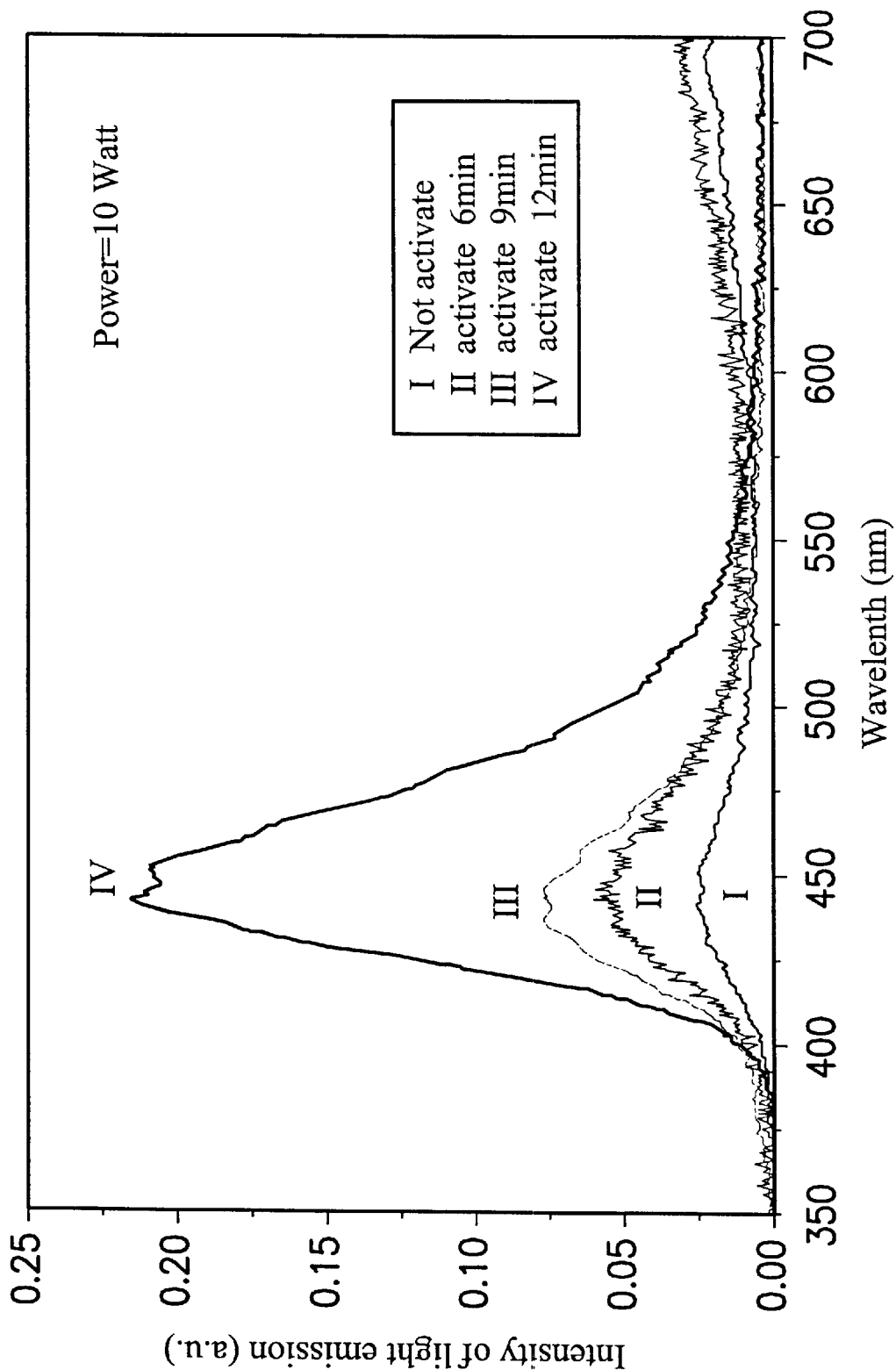
FIG. 6 shows the spectrum (frequency response) of a gallium nitride film activated by the infrared lasers with different exposing time.

FIG. 6 shows the spectrum (frequency response) of a gallium nitride film activated by the infrared lasers with different exposing time. Reading from FIG. 6, as the time duration of exposing the P-type gallium nitride film to the infrared laser increases (wherein the power is 10 W), the intensity of light emission at a wavelength of about 450 nm (blue-light) increases correspondingly. Therefore, it is clear that the intensity of the light emission at a wavelength of about 450 nm can be improved by increasing the time duration of exposing the P-type gallium nitride film to the infrared laser for activation.

From the experimental data shown in FIGS. 1 to 6, P-type gallium nitride films can be activated through the present invention to increase the hole concentration thereof and reduce the resistivity thereof. In addition, P-type gallium nitride films can present better (blue) light emission response at the wavelength of about 450 nm by using a laser light source.

The method disclosed by S. Nakamura (Nichia Chemical Industries, Ltd. Japan) is one of the prevailing ways of activating P-type gallium nitride films. However, the cited art of Nakamura carries out the activating process at a temperature of between 400 and 1200° C. (generally set to be about 700° C.), in the ambience of nitrogen gas; and a specific processing temperature between 400~1200° C. is kept longer than one minute during the activating process.

As to the present invention, the activating process using a laser light source can be carried out in the ambience of atmosphere rather than in the ambience of special gas (such as nitrogen gas or inert gas). In addition, the time duration of the activating process can be selected by adjusting the emission power and the power density of the laser light source, and selecting focusing distance of the laser light source to the P-type gallium nitride films. For these reasons, the present invention is more economical and effective for the application in the optoelectronic industry.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of activating a p-type compound semiconductor film by using infrared lasers for reducing the resistivity thereof, comprising:

growing a first p-type semiconductor film selected from a group consisting of group III–V nitrides and group II–VI compounds doped with p-type impurities; and activating said first p-type semiconductor film by exposing infrared laser sources to irradiate the first p-type semiconductor film for an extended duration time at high intensity to break the bonds between the p-type impurities and undesired atoms such that the carriers of the p-type impurities are released, the act of activating transforming said first p-type semiconductor film into a second p-type semiconductor having lower resistivity compared with said first p-type semiconductor film.

2. The method as claimed in claim 1, wherein said resistivity of said second p-type compound semiconductor is decreased while said intensity is increased.

3. The method as claimed in claim 1, wherein said resistivity of said second p-type compound semiconductor is decreased while said duration time is increased.

4. The method as claimed in claim 1, wherein said infrared laser exposes said first p-type compound semiconductor film with longer duration time and high intensity so as to increase the hole concentration thereof.

5. The method as claimed in claim 1, wherein said resistivity of said p-type compound semiconductor is about 1.2 $\Omega$cm while said intensity is about 10 W.

6. The method as claimed in claim 1, wherein said resistivity of said second p-type compound semiconductor is about 1.48 $\Omega$cm while said duration time is about 9 minutes and said intensity is about 10 W.

7. The method as claimed in claim 1, wherein said resistivity of said second p-type compound semiconductor is about 1.2 $\Omega$cm while said duration time is about 12 minutes and said intensity is about 10 W.

8. A method of activating p-type gallium nitride film by using an infrared laser for reducing the resistivity thereof, comprising:

growing a first p-type gallium nitride film doped with p-type impurities; and activating said first p-type gallium nitride film by exposing infrared laser to irradiate the first p-type gallium nitride film for an extended duration time at high intensity to break the bonds between the p-type impurities and undesired atoms such that the carriers of the p-type impurities are released, the act of activating transforming said first p-type gallium nitride film into a second p-type gallium nitride having lower resistivity compared with said first p-type gallium nitride film.

9. The method as claimed in claim 8, wherein said resistivity of said second p-type gallium nitride is decreased while said intensity is increased.

10. The method as claimed in claim 8, wherein said resistivity of said second p-type gallium nitride is decreased while said duration time is increased.

11. The method as claimed in claim 8, wherein said infrared laser exposes said first p-type gallium nitride film with longer duration time and high intensity so as to increase the hole concentration thereof.

12. The method as claimed in claim 8, wherein said resistivity of said second p-type gallium nitride is about 1.2 $\Omega$cm while the intensity of the infrared laser is about 10 W.

13. The method as claimed in claim 8, wherein said resistivity of said second p-type gallium nitride is about 1.48 $\Omega$cm while said duration time is about 9 minutes and said intensity is about 10 W.

14. The method as claimed in claim 8, wherein said resistivity of said second p-type gallium nitride is about 1.2 $\Omega$cm while said duration time is about 12 minutes and said intensity is about 10 W.

* * * * *